(12) United States Patent
Gilmore et al.

(10) Patent No.: US 8,220,647 B2
(45) Date of Patent: Jul. 17, 2012

(54) LOW THERMAL MASS SEMICONDUCTOR WAFER BOAT

(75) Inventors: Brian Lawrence Gilmore, Allen, TX (US); Lance G. Hellwig, Florissant, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 13/232,684

(22) Filed: Sep. 14, 2011

(65) Prior Publication Data

US 2012/0077138 A1 Mar. 29, 2012

Related U.S. Application Data

(62) Division of application No. 12/165,048, filed on Jun. 30, 2008, now Pat. No. 8,042,697.

(51) Int. Cl.
*A47G 19/08* (2006.01)
(52) U.S. Cl. .................................................. 211/41.18
(58) Field of Classification Search ............... 211/41.18, 211/40, 41.12, 134, 71.01; 118/500; 206/710, 206/454, 832; 414/935; 432/253, 258, 81
See application file for complete search history.

(56) References Cited

U.S. PATENT DOCUMENTS

| | | | | |
|---|---|---|---|---|
| 1,587,693 | A * | 6/1926 | Beland et al. | 4/654 |
| 5,199,582 | A * | 4/1993 | Halstrick | 211/135 |
| 5,482,558 | A * | 1/1996 | Watanabe et al. | 118/728 |
| 5,516,283 | A | 5/1996 | Schrems | |
| 5,577,621 | A * | 11/1996 | Yi | 211/41.18 |
| 6,099,302 | A * | 8/2000 | Hong et al. | 432/259 |
| 6,474,987 | B1 * | 11/2002 | Nakai et al. | 432/258 |
| 6,488,497 | B1 * | 12/2002 | Buckley et al. | 432/258 |
| 6,497,403 | B2 * | 12/2002 | Ries | 269/266 |
| 6,761,771 | B2 * | 7/2004 | Satoh et al. | 118/725 |
| 6,966,771 | B2 * | 11/2005 | Irie et al. | 432/253 |
| 7,033,126 | B2 * | 4/2006 | Van Den Berg | 414/416.03 |
| 7,033,168 | B1 * | 4/2006 | Gupta et al. | 432/253 |
| 7,077,913 | B2 * | 7/2006 | Shimada | 118/725 |
| 7,153,785 | B2 * | 12/2006 | Kobayashi et al. | 438/770 |
| 7,201,280 | B2 * | 4/2007 | Cho | 211/41.18 |
| 7,204,887 | B2 * | 4/2007 | Kawamura et al. | 118/725 |
| 7,210,925 | B2 * | 5/2007 | Adachi | 432/253 |
| 7,256,375 | B2 * | 8/2007 | Oosterlaken | 219/634 |
| 7,331,780 | B2 * | 2/2008 | Adachi | 432/253 |

(Continued)

FOREIGN PATENT DOCUMENTS

EP 1469508 A1 10/2004

(Continued)

OTHER PUBLICATIONS

PCT International Search Report and Written Opinion of the International Searching Authority mailed on Sep. 9, 2009 regarding PCT/US2009/048126 filed on Jun. 22, 2009; 13 pages.

(Continued)

*Primary Examiner* — Jennifer E. Novosad
(74) *Attorney, Agent, or Firm* — Armstrong Teasdale, LLP

(57) ABSTRACT

A wafer boat for a semiconductor wafer includes vertical rods, fingers supported by the vertical rods, and plates supported by the fingers. The plate has a support surface for supporting the wafer and a recessed surface spaced from the support surface and spaced from the wafer. A plurality of holes extends from the recessed surface, and the support surface is free of holes to inhibit contamination of the wafer.

13 Claims, 11 Drawing Sheets

U.S. PATENT DOCUMENTS

| | | | | |
|---|---|---|---|---|
| 7,393,417 | B1 * | 7/2008 | Maeda et al. | 118/725 |
| 7,484,958 | B2 * | 2/2009 | Kobayashi | 432/258 |
| 7,625,205 | B2 * | 12/2009 | Sasajima et al. | 432/253 |
| D616,391 | S * | 5/2010 | Sato | D13/182 |
| D616,396 | S * | 5/2010 | Sato | D13/182 |
| 8,042,697 | B2 * | 10/2011 | Gilmore et al. | 211/41.18 |
| 2005/0042568 | A1 * | 2/2005 | Irie et al. | 432/258 |
| 2005/0145584 | A1 * | 7/2005 | Buckley et al. | 211/41.18 |
| 2006/0213424 | A1 * | 9/2006 | Mueller et al. | 117/15 |
| 2007/0068882 | A1 * | 3/2007 | Yoshizawa | 211/41.18 |
| 2007/0148607 | A1 * | 6/2007 | Tani | 432/241 |
| 2008/0041798 | A1 * | 2/2008 | Gilmore et al. | 211/41.18 |
| 2008/0153181 | A1 * | 6/2008 | Otsuka | 438/7 |
| 2008/0264343 | A1 * | 10/2008 | Hagihara | 118/728 |
| 2010/0098519 | A1 | 4/2010 | Shive et al. | |
| 2011/0018651 | A1 * | 1/2011 | Ikeda et al. | 333/118 |

FOREIGN PATENT DOCUMENTS

| | | |
|---|---|---|
| EP | 1608011 A1 | 12/2005 |
| JP | 10270369 A | 10/1998 |
| JP | 11260746 A | 9/1999 |
| JP | 2003289044 A | 10/2003 |
| JP | 2006005271 A | 1/2006 |
| JP | 2008108926 A | 5/2008 |
| JP | 2008130695 A | 6/2008 |
| WO | 2006118774 A2 | 9/2006 |

OTHER PUBLICATIONS

Written Opinion issued in related Singapore Patent Application No. 201009027-2 dated Dec. 12, 2011; 9 pages.

* cited by examiner

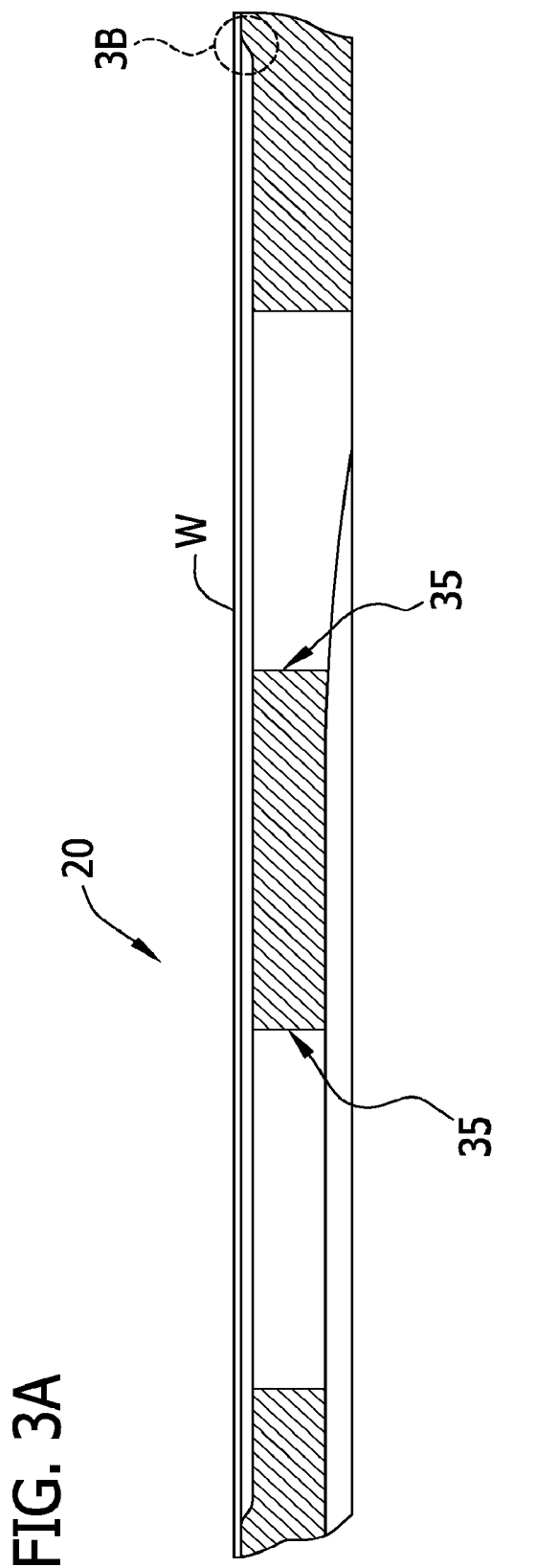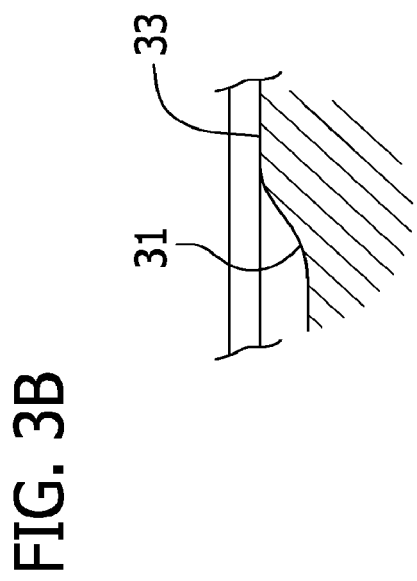

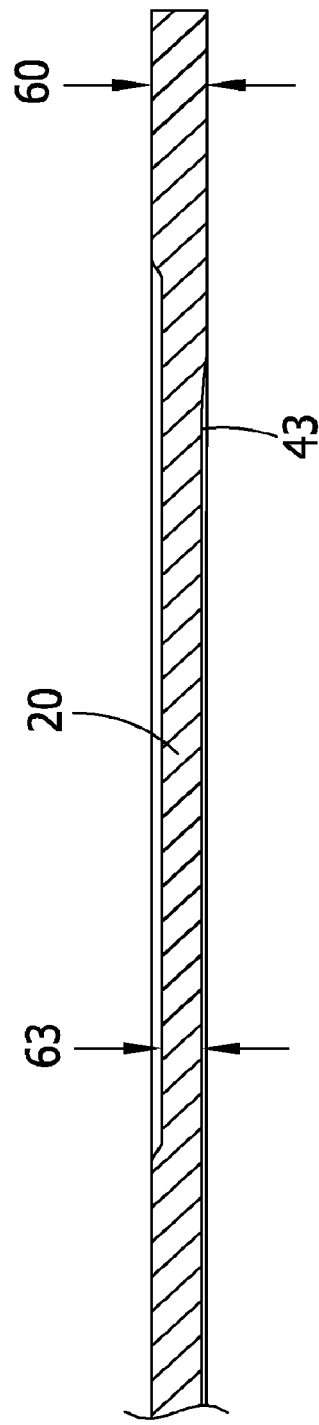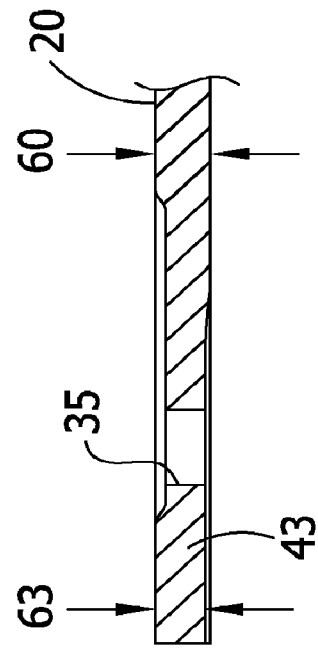
FIG. 7
FIG. 8

LOW THERMAL MASS SEMICONDUCTOR WAFER BOAT

CROSS REFERENCE

This application is a divisional of U.S. patent application Ser. No. 12/165,048, filed Jun. 30, 2008, which is incorporated herein by reference in its entirety.

BACKGROUND

This invention relates generally to semiconductor wafer supports, and more particularly to a low thermal mass semiconductor wafer support for use in heat treatment of semiconductor wafers in a furnace.

High temperature heat-treatment (e.g., annealing) of semiconductor wafers is commonly used to achieve certain desirable characteristics. For example, such a process may be used to create a defect free layer of silicon on the wafers. The high temperature annealing process of the type to which the present invention particularly relates is carried out in a vertical furnace which typically subjects the wafers to temperatures above 1100 degrees C., e.g., between about 1200 degrees C. and about 1300 degrees C.

During high temperature heat-treatment, at temperatures above 750 degrees C. and especially above 1100 degrees C., the silicon wafers become more plastic. If the silicon wafers are not adequately supported during heat treatment, the wafers may undergo slip due to local gravitational and thermal stresses. As is well known in the art, slip may introduce contaminants into the device areas of the wafers. Moreover, excessive slip may lead to plastic deformation of the wafers, which in turn may lead to production problems, such as photolithography overlay failures causing yield losses in device manufacture.

Vertical wafer boats or racks are used to adequately support semiconductor wafers, and, to minimize the local gravitational and thermal stresses. The support attempts to prevent slip and plastic deformation while the wafers are being heat treated. A typical vertical wafer boat used in a vertical furnace comprises three or more vertical rails also referred to as rods. The rods typically have grooves or laterally extending fingers for supporting the wafers between the vertical rods within the boat. Each wafer may rest directly on fingers (or grooves) lying generally in a common horizontal plane. This configuration is common in the older art and is adequate when heat treating 200 mm and smaller diameter wafers. Alternatively, each wafer may rest on a wafer holder platform, e.g., a ring or solid plate, supported by the fingers (or in grooves), lying generally in a common horizontal plane. This configuration is common in the newer art and is usually necessary to adequately support 300 mm and larger diameter wafers. The 300 mm and larger diameter wafers are subjected to more local gravitational and thermal stresses than smaller diameter wafers, and the wafer holder platforms better support the 300 mm wafers by increasing the areas of the wafers that are supported.

Co-assigned U.S. Pat. No. 7,033,168, which is incorporated herein by reference, shows one suitable type of wafer boat for use in the above-described process. WO 2006/118774 ('774) shows another type that includes shelves for supporting the wafers. Each shelf 24 includes a plurality of holes 32, 34 that "are useful to relieve stress in the thin shelves 24, to reduce thermal mass, and to allow the furnace ambient to reach a substantial portion of the wafer backside, thereby preventing the wafers from sticking to the shelves 24. The planar shape of the shelf 24 allows it to be economically machined from slices of material, especially silicon, similar to wafers."

However, there are certain shortcomings in the prior art supports. For example, placing the wafers in contact with the hole edges of the '774 shelf will cause contamination of the wafer. Additionally, the '774 configuration will cause slip in the wafer. A better wafer support that will not cause contamination or slip is needed.

BRIEF SUMMARY

In one aspect, a support for a semiconductor wafer includes a plate having a support surface for supporting the wafer and a recessed surface spaced from the support surface and spaced from the wafer. A plurality of holes extends from the recessed surface, and the support surface is free of holes to inhibit contamination of the wafer.

In another aspect, a plate for supporting the semiconductor wafer includes top and bottom surfaces. The top surface includes a support surface and a recessed surface spaced vertically from the support surface. The plate includes a plurality of holes that extend from the recessed surface to the bottom surface. The support surface is free of holes.

In still another aspect, a wafer boat is for use in heat treatment of semiconductor wafers in a furnace. The boat includes vertical rods, fingers supported by the vertical rods and plates supported by the fingers. At least some of the plates include a support surface for supporting the wafer and a recessed surface spaced from the support surface and spaced from the wafer. A plurality of holes extends from the recessed surface, and the support surface is free of holes to inhibit contamination of the wafer.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 3A is a fragmentary section taken in the plane including line 3A-3A of FIG. 3 and showing a wafer on the platform;

FIG. 3B is a an enlarged portion of FIG. 3A;

FIG. 7 is a fragmentary section taken in the plane including line 4-4 of FIG. 3 showing the platform with the finger removed;

FIG. 8 is a fragmentary section taken in the plane including line 5-5 of FIG. 3 showing the platform with the finger removed;

Corresponding reference characters indicate corresponding parts throughout the drawings. Corresponding reference characters indicate corresponding parts throughout the drawings.

DETAILED DESCRIPTION

Figure 1:
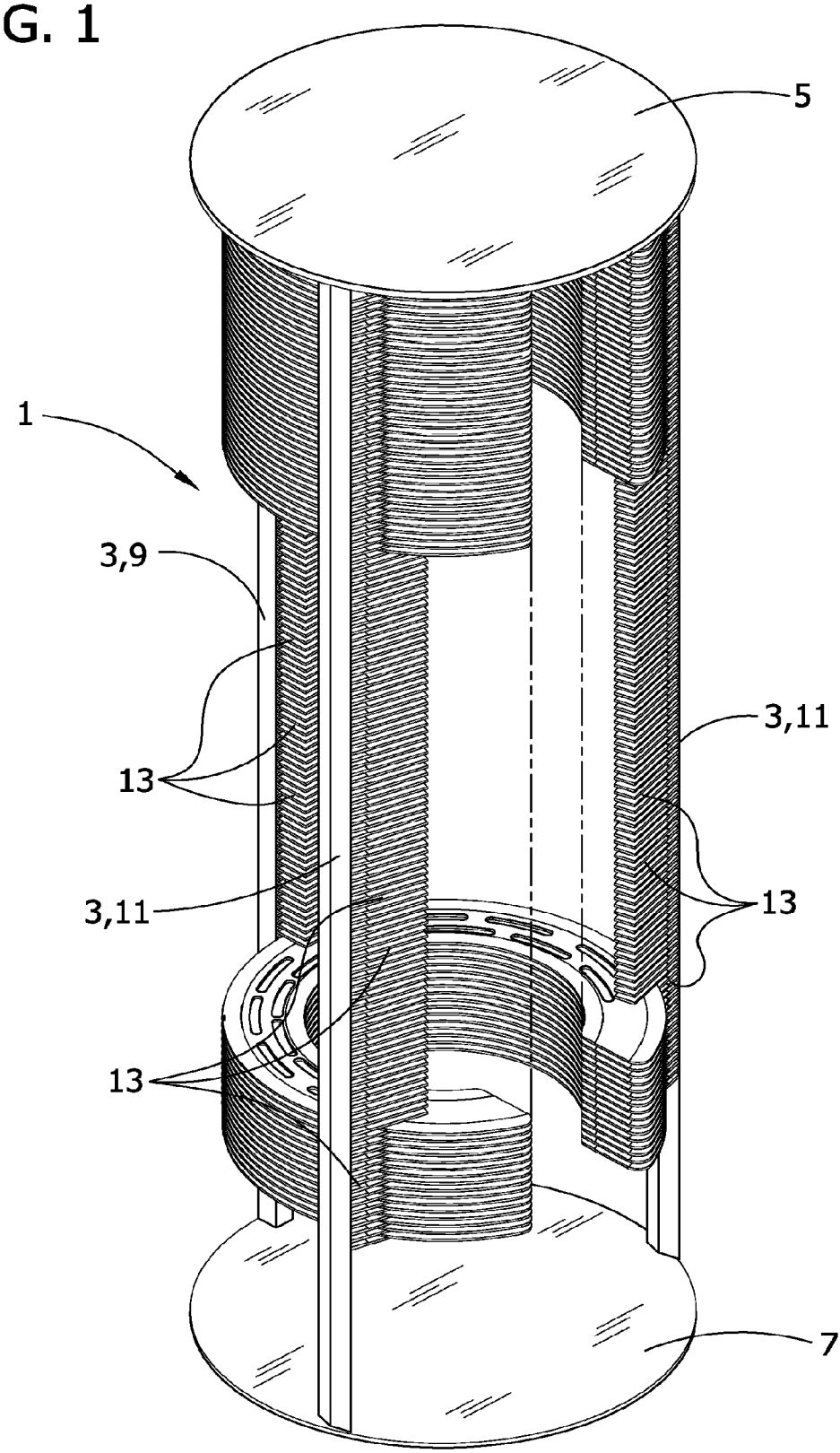
FIG. 1 is a perspective of a wafer boat having wafer holder platforms of one embodiment.

Referring now to the drawings and in particular to FIG. 1 which illustrates a semiconductor wafer boat, indicated generally at 1, constructed according to the principles of the present invention. The wafer boat 1 includes spaced-apart support rods 3 that are affixed to a top 5 and a base 7 of the boat to retain the positions of the rods relative to each other. When the wafer boat 1 is placed in a vertical furnace, the support rods 3 are generally vertical. In the illustrated embodiment, the wafer boat 1 has a central rod 9 and two forward rods 11.

The support rods 3 support laterally extending fingers 13. The fingers 13 may be integrally formed on the support rods 3. For example, cuts may be made in an elongate one-piece structure, forming the fingers 13. The fingers 13 of the wafer boat 1 are arranged in groups lying in different common generally horizontal planes along the vertical extent of the support rods 3.

Figure 2:
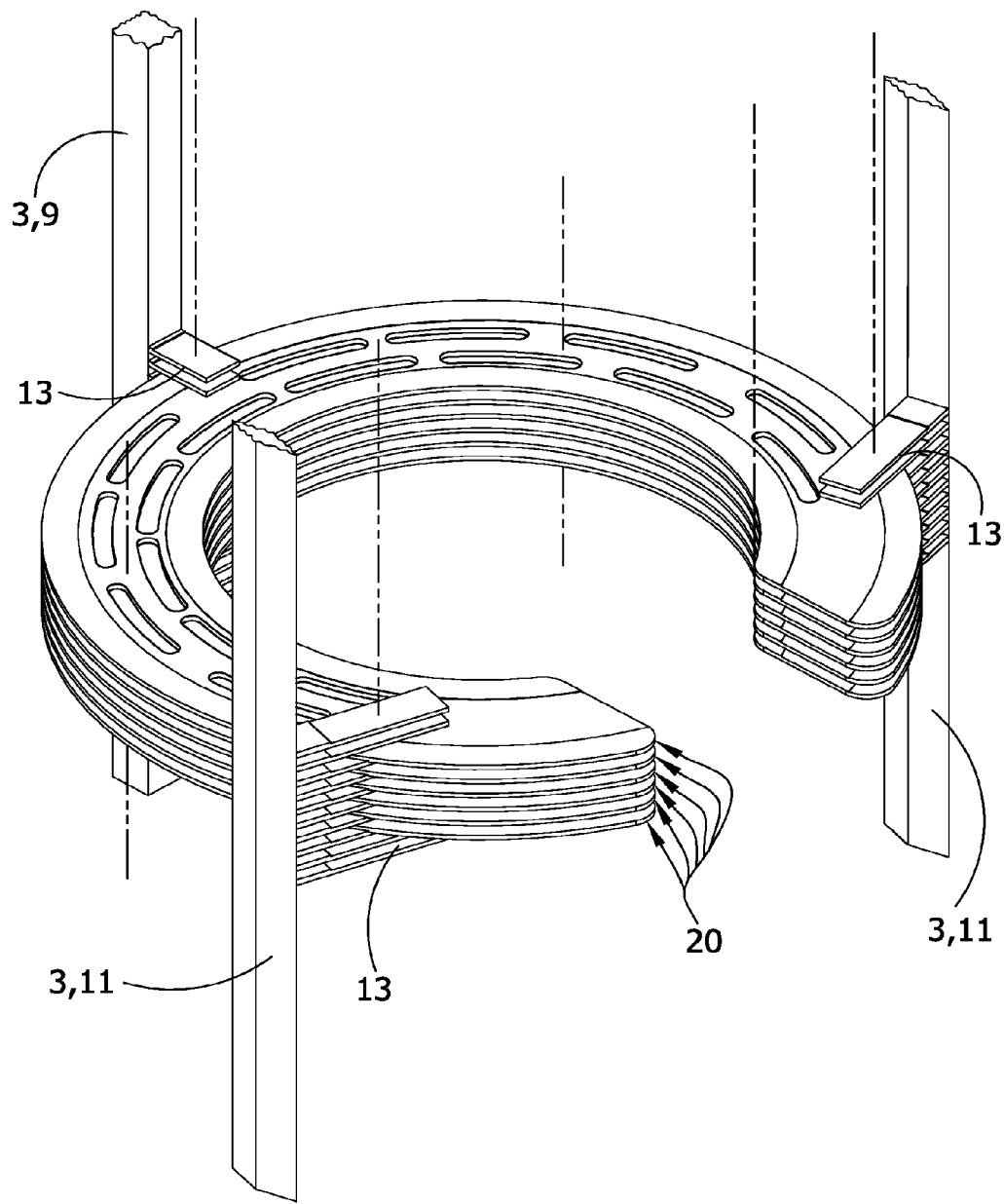
FIG. 2 is an enlarged fragmentary perspective of the wafer boat and platforms.
Figure 3:
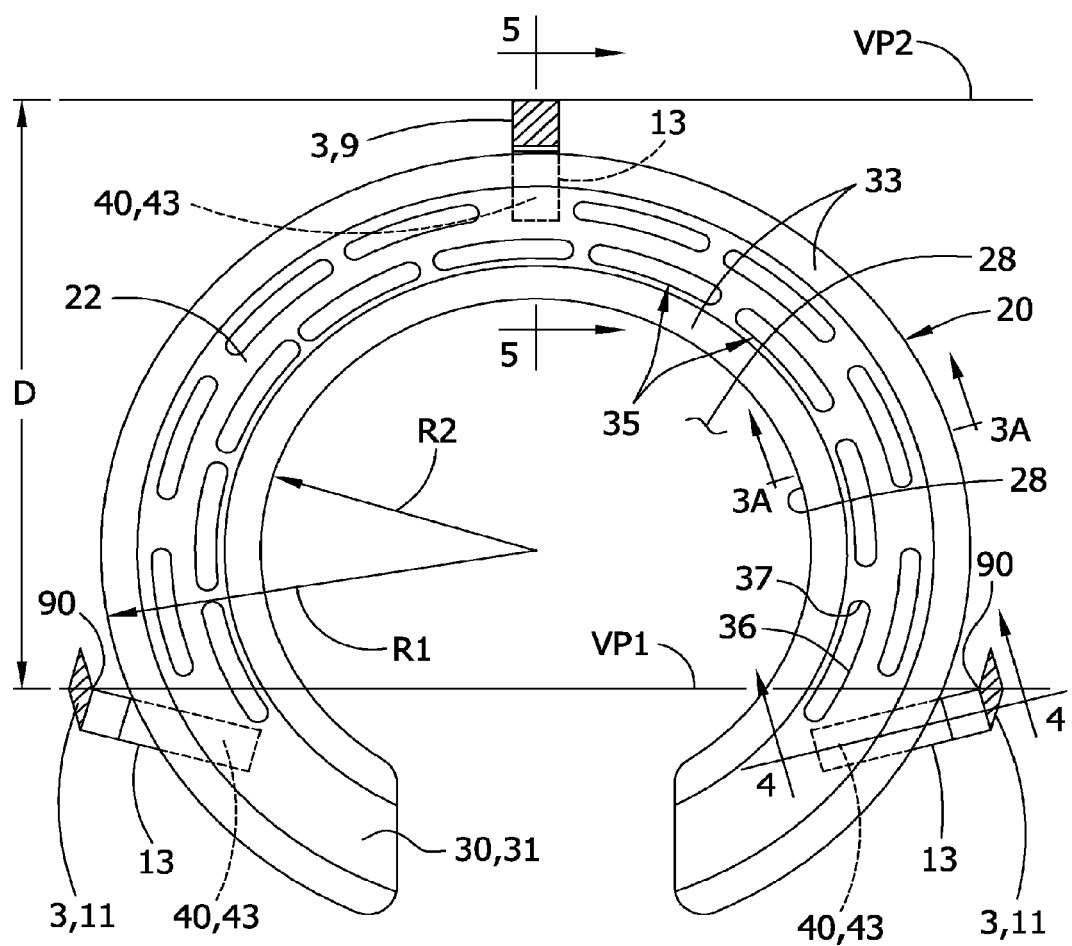
FIG. 3 is a top view of one of the wafer platforms.

Referring to FIGS. 2-3, each set of fingers 13 lie in a same generally horizontal plane engage and support a wafer holder platform 20 (broadly, a plate). The platform may also be commonly referred to as a support ring. The illustrated wafer holder platforms 20 are of an open-ring type generally having a C shape when viewed from above (plan view).

The open-ring type platform has top and bottom surfaces designated 22 and 24 (FIG. 6), respectively, an outer radius R1, and a hole 28 generally in the center portion of the disk having a radial opening extending from the hole to the outer periphery of the platform 20. Other types of wafer platforms, including a closed-ring type and a solid plate, are within the scope of this invention. For a wafer platform used to support 300 mm wafers, the radius R1 is about 150 mm, and a radius R2 of the hole 28 is about 95 mm.

In the illustrated embodiment, each wafer holder platform 20 has a recessed surface 30 defined by an arcuate groove 31 formed in the top surface 22. The groove is suitably between about 0.2 mm and about 0.5 mm deep. A pair of spaced apart plateaus 33 (broadly, support surfaces) are disposed on opposite sides of the groove. The plateaus 33 directly support a semiconductor wafer W (FIGS. 3A-3B) while the wafer rests on the wafer holder platform 20. By resting on the plateaus 33 and over the groove 31, the wafer can be removed from the wafer holder platform without the wafer sticking to the wafer holder platform, as is well known in the art.

Additionally, the plateaus 33 have no holes therein or therethrough. In other words, each plateau is a substantially smooth, planar surface, without any deviations such as holes, ridges or other features formed therein. Edges of holes or other features, if they existed on the plateaus, could cause contamination of the wafer due to the machining or forming step used to form the holes. Conventional ceramic forming or machining methods used to form the holes introduce the potential of contamination in and around the holes. Also, there is a risk that the edges of holes, if there were any formed in the plateaus, may be sharp and may damage the wafer. Because the plateaus (support surfaces) in this embodiment are free of holes, the wafer W will not be contaminated or damaged by the platform 20. Also, the plateaus 33 on each platform 20 are coplanar so that the wafer W lies flat across the plateaus. Again, the wafer W is not in contact with the recessed surface 30.

Figure 6:
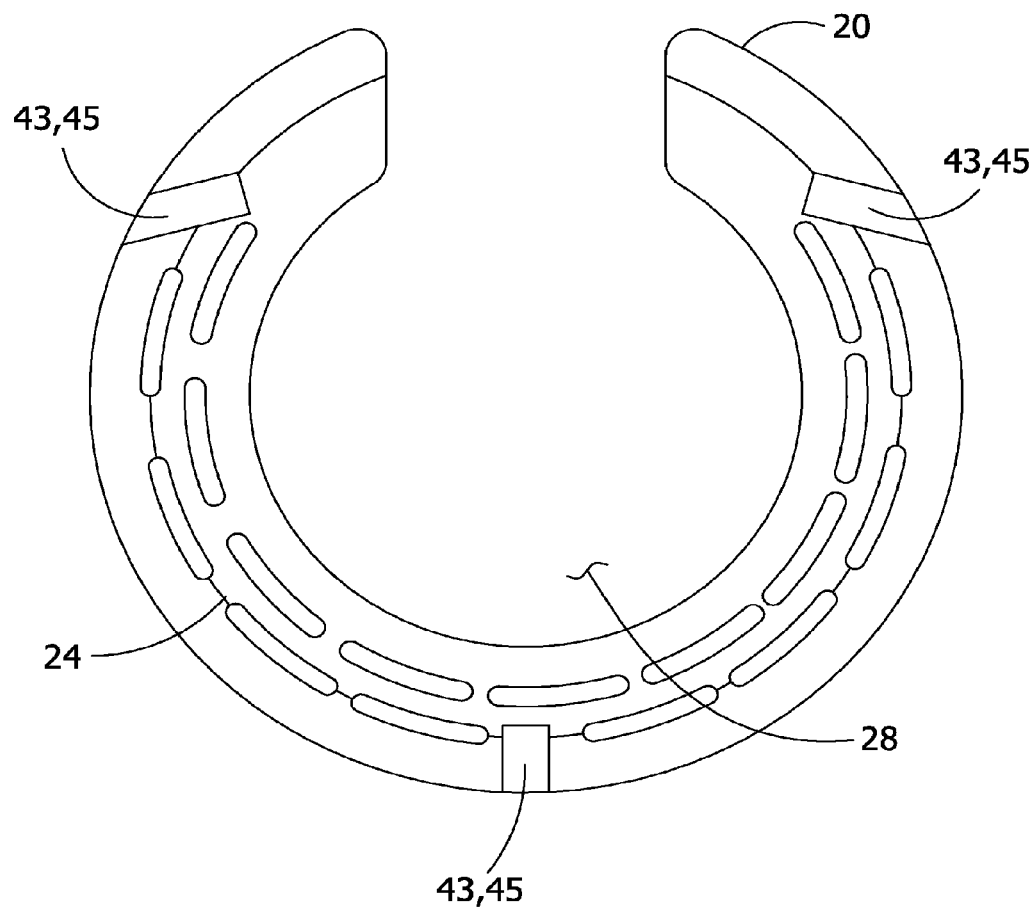
FIG. 6 is a bottom plan view of one wafer holder platform.

Slots 35 (broadly, holes) are formed in the recessed surface 30 of one embodiment. The slots are suitably formed using conventional ceramic forming tools. The slots extend from the recessed surface 30 to the bottom surface 24 (FIG. 6). Each slot has an elongate section 36 having an arc or curved shape that generally corresponds to the curve of the groove 31 and to the curve of the outer and inner edges of the platform 20. Each slot also has curved ends 37. The width of the slot 35 is less the width of the groove 31.

The slots reduce the area of the platform under the wafer W to less than 50% in one embodiment, to less than 45% in another embodiment, and to less than 40% in another embodiment. Note that the platform of U.S. Pat. No. 7,033,168 has an area under the wafer W of 52% or more. The slots do not add significantly to the manufacturing costs of the platform. Further, the slots do not negatively affect the structure of the platform 20. The reduction in area is directly proportional to a reduction in thermal mass and to a reduction in the thermal gradient from the center of the wafer W to the edge of the wafer. These reductions also reduce the risk that slip will be created in the wafer W during high temperature processing such as annealing.

It will be understood that constructions (not shown) other than those just described can be used within the scope of the present invention. The wafer boat 1 may be made of one of quartz, silicon, silicon nitride, or silicon carbide, or alternatively of a combination of one or more of quartz, silicon, silicon nitride or silicon carbide.

Figure 4:
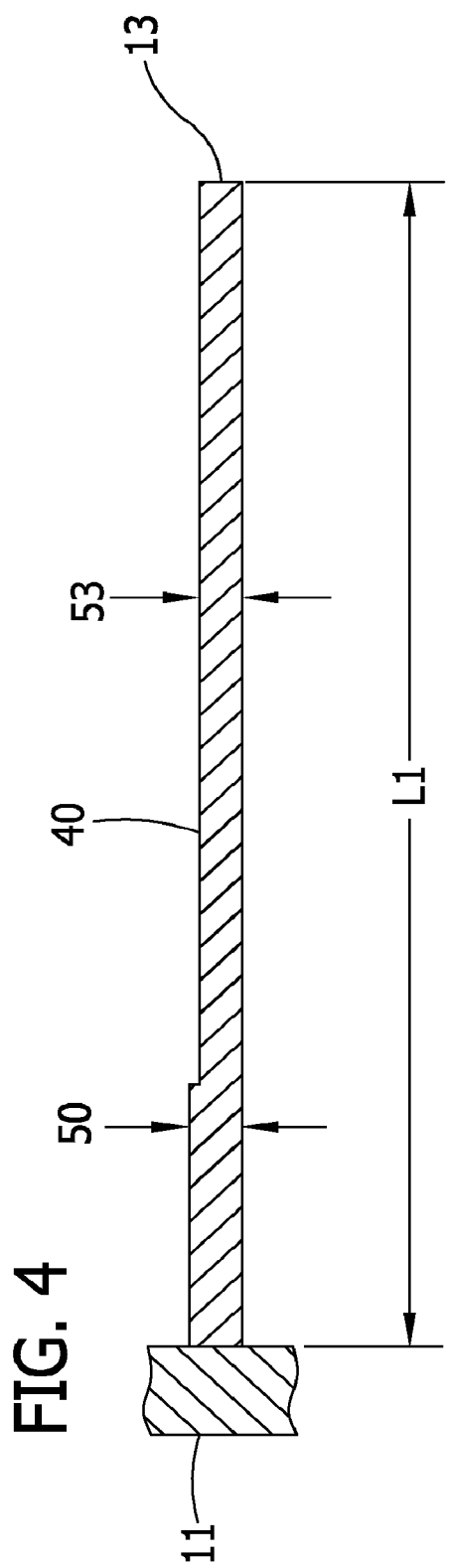
FIG. 4 is a fragmentary section taken in the plane including line 4-4 of FIG. 3 showing a single finger but with the platform removed.
Figure 5:
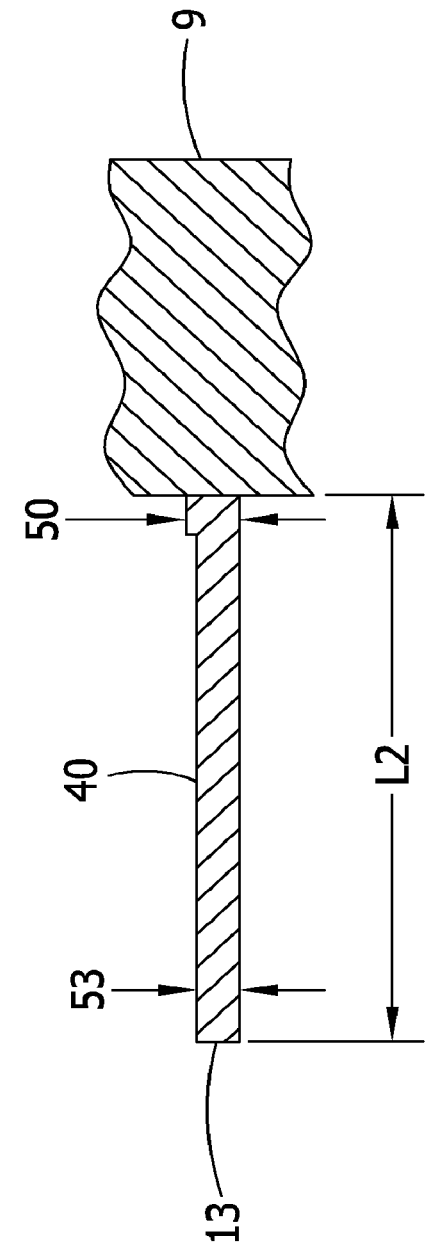
FIG. 5 is a fragmentary section taken in the plane including line 5-5 of FIG. 3 showing a single finger with the platform removed.
Figure 9:
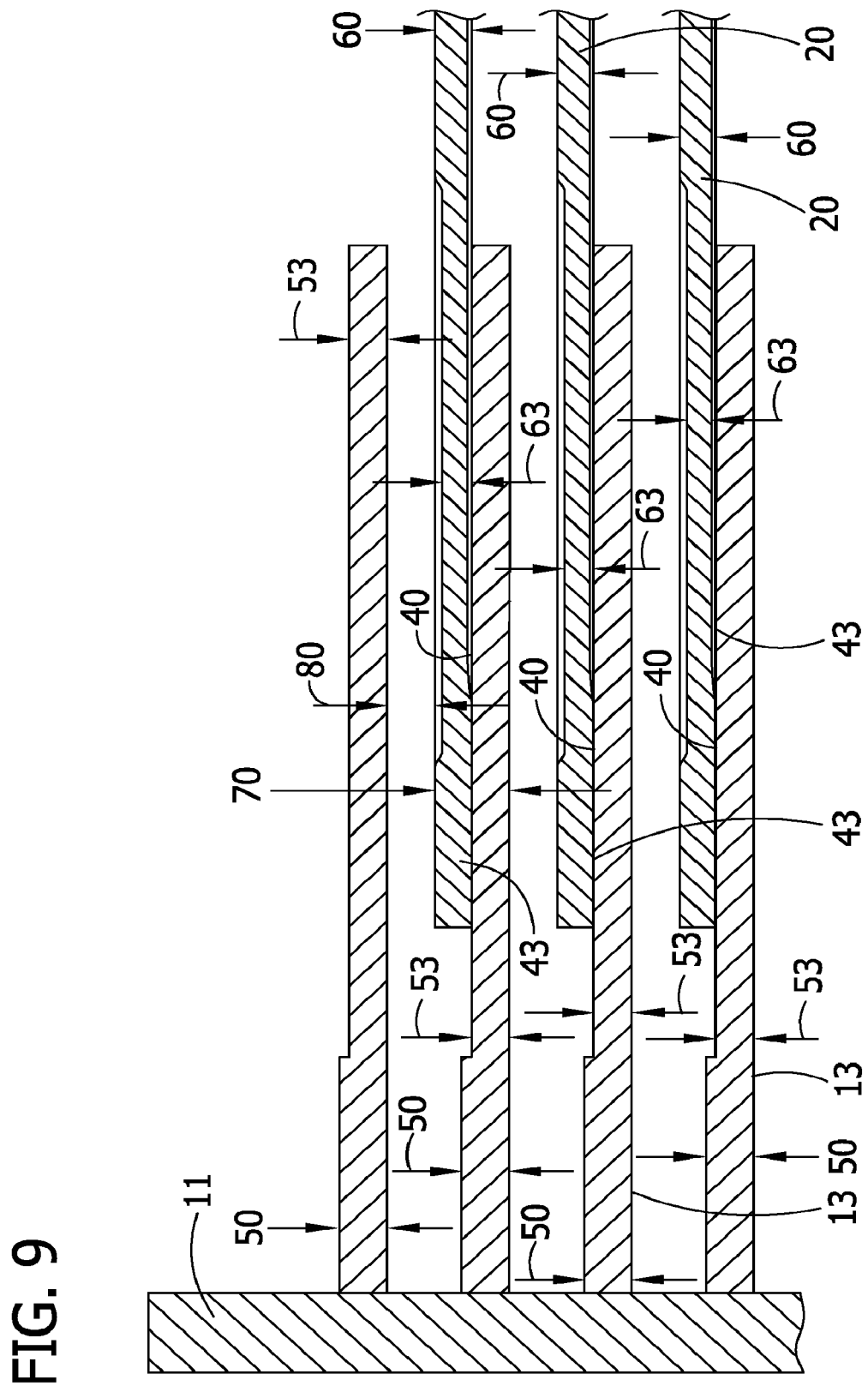
FIG. 9 is a fragmentary section similar to FIG. 5, but showing multiple fingers and platforms.
Figure 10:
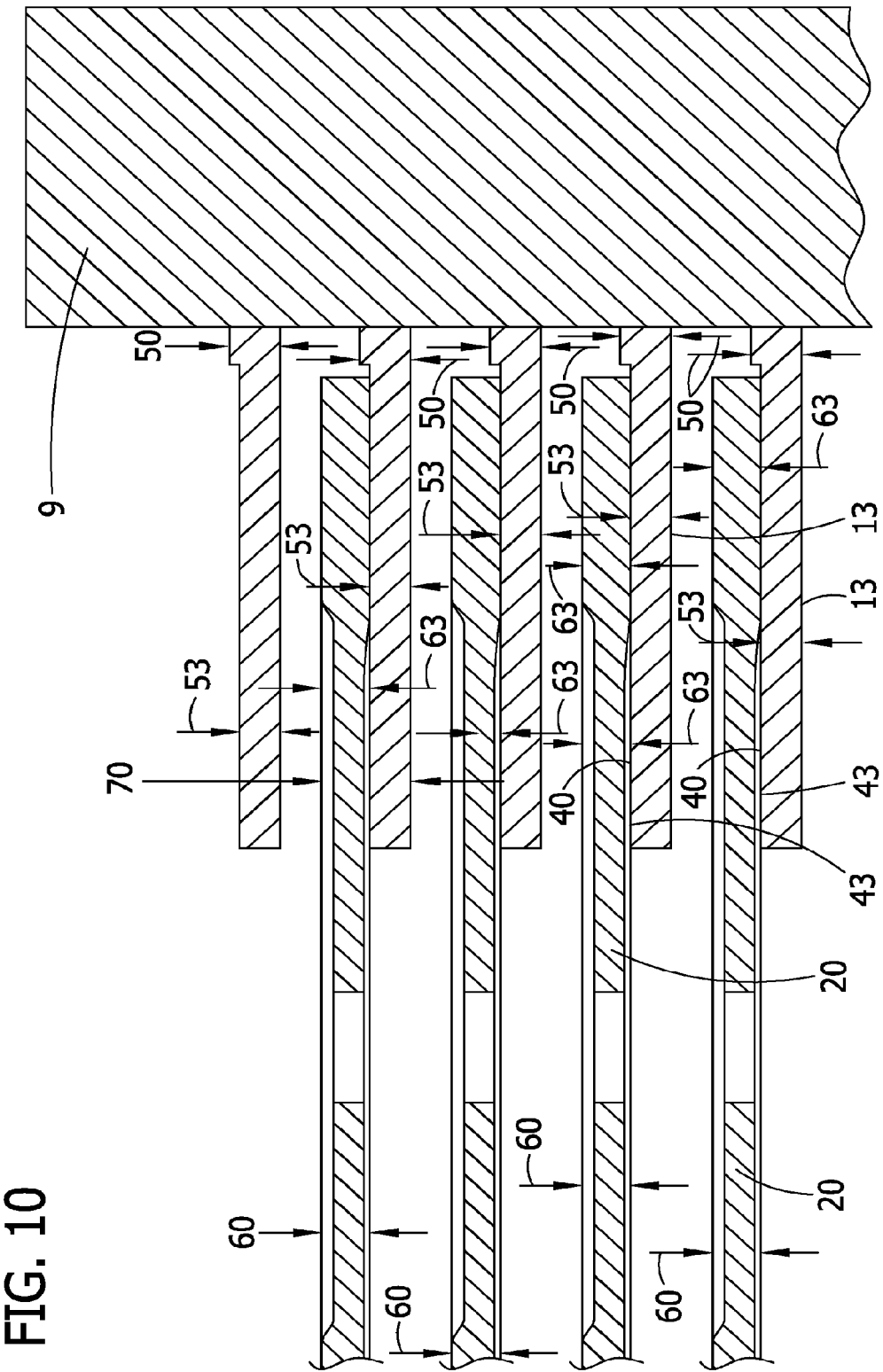
FIG. 10 is a fragmentary section similar to FIG. 4, but showing multiple fingers and platforms.
Figure 11:
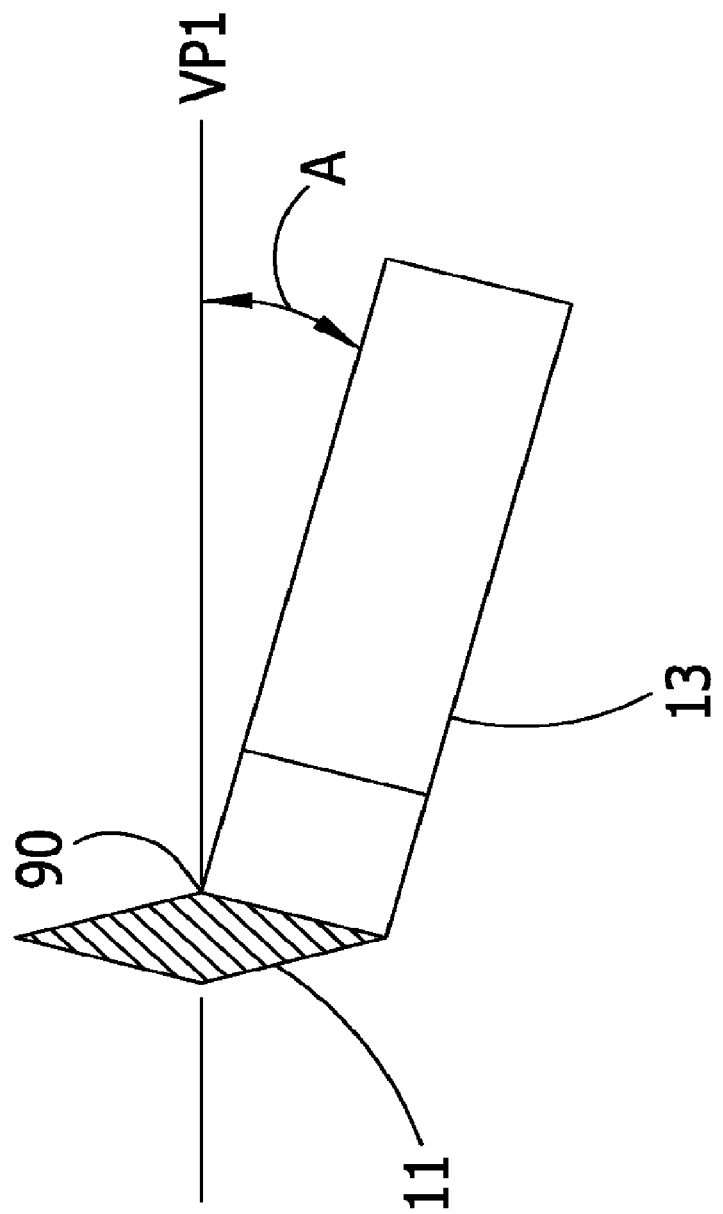
FIG. 11 is an enlarged plan view of an isolated finger extending from the left forward rod showing the angle at which the finger extends from the rod.

Referring now to FIGS. 4-10, each finger 13 of the wafer boat 1 has a support location 40 that engages and supports one of the wafer holder platforms 20 (FIGS. 4 and 5). Similarly, each wafer holder platform 20 has three support locations 43 that engage and are supported by the group of fingers 13 lying in the common horizontal plane (FIGS. 6 and 10). Each support location 40 of the fingers 13 is adapted to underlie the wafer holder platform 20 at the respective support location 43 of the wafer platform (FIGS. 7 and 8). Similarly, each support location 43 of the wafer holder platforms 20 is adapted to overlie the respective support location 40 of the respective finger 13.

Referring particularly to FIGS. 4 and 5, each finger 13 has a non-uniform thickness along its length L, such that each finger has a first overall maximum thickness 50 which is greater than a second maximum thickness 53. The first overall maximum thickness 50 is the thickest part of the entire finger 13. In one embodiment, the first overall maximum thickness 50 is at least about 2.0 mm, and in the illustrated embodiment is about 2.5 mm. The second maximum thickness 53 of the finger is the maximum thickness of the finger 13 within the boundaries of the support location 40. In the illustrated embodiment, the support location 40 and the second overall maximum thickness 53 of the finger 13 are located at the free end of the finger. The second maximum thickness 53 of the fingers 13 is at least about 0.5 mm, and in the illustrated embodiment is about 2.0 mm. The illustrated dimensions of the wafer boat 1 and its components (given above and hereinafter) are suitable dimensions for constructing a wafer boat for use in high-temperature heat treatment of 300 mm diameter silicon wafers in a vertical furnace. Other dimensions may be used within the scope of the present invention.

Referring particularly to FIGS. 7 and 8, each wafer holder platform 20 (like each finger 13) has a non-uniform thickness such that each platform has a first overall maximum thickness 60 that is the largest thickness dimension of the entire wafer holder platform. The first overall maximum thickness 60 may be at least about 2.0 mm, and in the illustrated embodiment is about 2.0 mm. The wafer holder platform 20 has a second maximum thickness 63 at each support location 43 that is less than the first maximum thickness 60 of the wafer holder platform. In the illustrated embodiment, the wafer holder platform 20 has grooves 45 in its bottom surface 24 that correspond to the support locations 43 of the wafer holder platform (FIG. 6). The second maximum thickness is at least about 0.5 mm, and in the illustrated embodiment is about 1.0 mm.

Referring particularly to FIGS. 9 and 10, when the wafer holder platforms 20 are resting on the fingers 13, there is a combined maximum thickness 70 at each support location 40, 43 of the fingers and the platforms that is less than the first overall maximum thickness 50 of each finger plus the first overall maximum thickness 53 of each wafer holder platform. In the illustrated embodiment, the combined maximum thickness at each support location 40, 43 is about 4.0 mm. The combined maximum thickness 70 at each support location 40, 43 leaves a vertical space 80 between the platform 20 and the fingers 13 just above the platform. The vertical space 80 allows a robotic arm to introduce and remove the wafer. In the illustrated embodiment, the vertical space 80 is about 3.8 mm.

As described above, the illustrated embodiment shows both the fingers 13 and wafer holder platforms 20 having second maximum thicknesses 53, 63 less than the respective first overall maximum thicknesses 50, 60. It is understood, however, that the fingers 13 may not have a second maximum thickness less than the first overall maximum thickness 50. That is, the thickness of each finger 13 may be substantially uniform along its length, and only the wafer holder platforms 20 have a second maximum thickness 63 which is less than the first maximum thickness 60. Alternatively, the wafer holder platforms 20 may not have a second maximum thickness less than the first overall maximum thickness 60. That is, the thickness of each wafer holder platform 20 may be substantially uniform along its length, and only the fingers 13 have a second maximum thickness 53 which is less than the first maximum thickness 50. It is noted that these embodiments are satisfactory for the intended purpose of the present invention as long as the combined maximum thickness 70 at each support location 40, 43 of the fingers 13 and wafer holder platforms 20 is less than the combined first maximum thicknesses 50, 60 of the fingers 13 and wafer holder platforms 20.

By reducing the thickness of each finger 13 and the thickness of each wafer holder platform 20 at the respective support locations 40, 43, as described above, the vertical space in the wafer boat 1 occupied by the combined thickness 70 of the each finger and each platform is reduced. This reduction in combined thickness 70 creates more open vertical space within the wafer boat 1, which in turn, can be used to add more fingers 13 and platforms 20. Increasing the number of platforms 20 increases the number of wafers that can be housed in the same vertical space within the wafer boat 1. Decreasing the vertical space occupied by the combined thickness 70 of each finger 13 and each wafer holder platform 20 at the respective support locations 40, 43 increases wafer throughput of the vertical furnace and production of heat-treated semiconductor wafers, while decreasing production costs.

However, the combined thickness of each finger 13 and each wafer holder platform 20 at the respective support locations 40, 43 is sufficient to provide a stable foundation for holding the wafer so as to avoid slip and plastic deformation of the wafer during heat treatment.

The illustrated wafer boat 1 of the present invention can hold up to about 135 wafers or about 1.2 wafers per centimeter of height of the wafer boat. The overall height of the wafer boat 1 of the illustrated embodiment is such that it can fit within a quartz tube of an ASM® A412 vertical furnace. A wafer boat 1 constructed according to the teachings of the prior art typically holds less than 1 wafer per centimeter of height of the wafer boat. Thus, the wafer boat 1 of the present invention increases throughput by up to 50% without, as stated above, compromising wafer quality.

Referring to FIG. 3, points nearest to the central rod 9 (i.e., most rear points) where the forward rod fingers 13 and the forward rods 11 meet are designated 90. These points 90 are located in a forward vertical plane VP1 that is spaced forward from a parallel rear vertical plane VP2 that is tangent to the wafer boat 1 at the back of the boat. In the illustrated embodiment, the central rod 9 defines the back of the wafer boat 1. The optimal configuration of the support rods 3 and fingers 13 (i.e., the arrangement of the rods and fingers that would give the most support to the wafer holder platforms) is where the rods are spaced equidistantly apart forming an equilateral triangle arrangement and the fingers extend toward the center of the wafer holder platform 20. In this arrangement, the support of the fingers 13 is equally distributed along the circumference of the wafer holder platform 20. However, this optimal configuration is not feasible for use with 300 mm and larger diameter wafer boats because of dimensional constraints imposed by the diameter of the wafers to be received in the boat and the internal diameter of the vertical furnace. The distance between two support rods 3 must be greater than the diameter of the wafer, e.g., 300 mm, so that the wafer can be received within the boat (e.g., between the forward rods 11). Moreover, the cross-sectional diameter of the wafer boat 1 cannot be greater than the internal diameter of a quartz tube of the vertical furnace, or else the boat will not fit in the furnace. For example, the internal diameter of a quartz tube for the ASM A412 vertical furnace is about 340 mm. Positioning the three support rods 3 at least 300 mm apart (since they are optimally in an equilateral triangle arrangement) makes the diameter of the wafer boat 1 much greater than the internal diameter of the quartz tube, and the boat would not fit in the furnace. It is noted that even if a larger diameter furnace were possible, an equilateral triangle arrangement of the support rods 3 would require very long fingers 13, resulting in a wafer boat with low mechanical stability because of the lengths of the fingers.

Because the support rods 3 cannot be equidistantly spaced apart, the prior art teaches the configuration of the forward rods 11 spaced apart the minimal distance necessary to allow the wafers to be received in the boat 1 (e.g., in the illustrated embodiment the distance is based on 300 mm wafers) and positioned in the forward vertical plane VP1 as far away from the rear vertical plane VP2 as possible without wafer boat exceeding its diameter constraint imposed by the internal diameter of the vertical furnace. The fingers 13 extending from the forward rods 11 also lie in the forward plane VP1. This configuration is an attempt to best distribute the support of the fingers 13 along the circumference of the wafer holder platform 20 while staying within the imposed constraints. However, this configuration may not adequately support the area of the wafer holder platform 20 forward of the forward plane VP1. Inadequate support of the wafer holder platform 20 forward of the forward rods 11 may cause plastic deformation of the wafer platform 20 (especially in the open ring type of the illustrated embodiment) leading to slip and possibly plastic deformation in the silicon wafers during high-temperature heat treatment in the vertical furnace.

Figure 12:
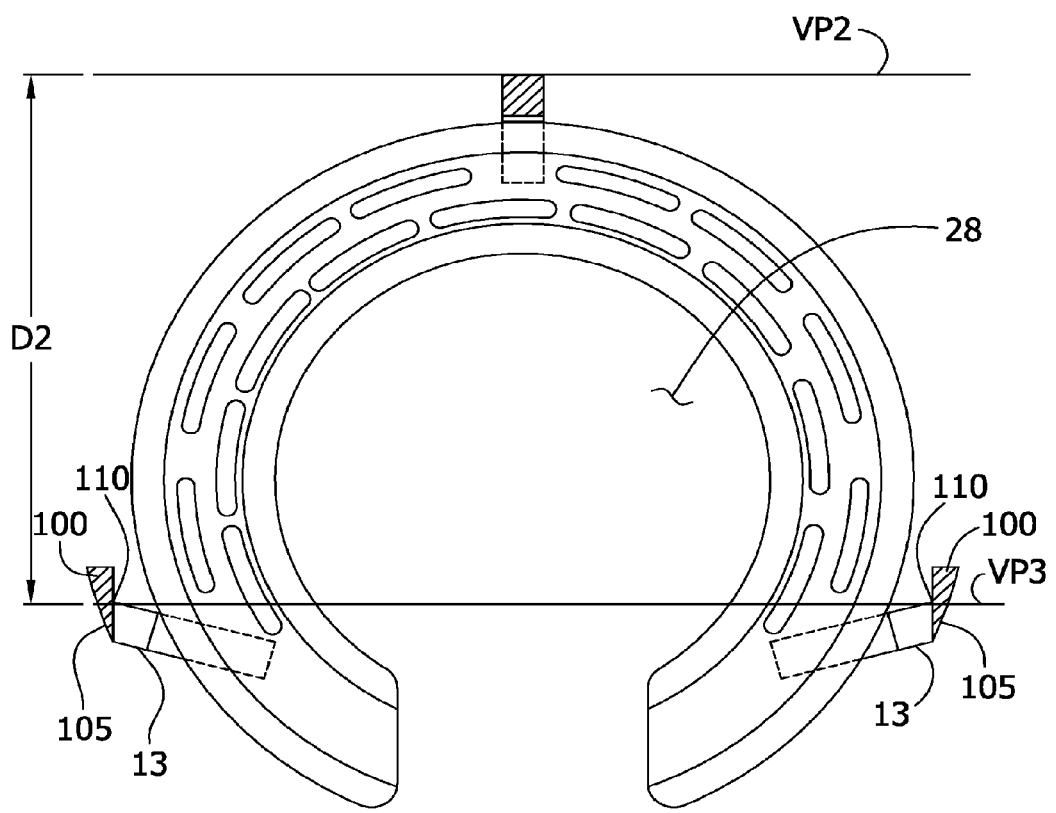
FIG. 12 is a horizontal cross-section of the wafer boat with another embodiment of the forward rods having wedge-shaped cross-sections.

In one embodiment of the wafer boat 1 of the present invention, the fingers 13 on the forward rods 11 are angled forward an angle A relative to the forward plane VP1 to allow the support locations 40 of the fingers to underlie portions of the areas of the wafer holder platforms 20 that are forward of the forward plane VP1 (FIG. 12). The angling of the fingers 13 on the forward rods 11, in effect, gives greater support to the forward part of the wafer holder platform 20 than would be given if the fingers extended along the forward plane VP1 (as in the prior art). In one embodiment, the angle A is between 10 and 20 degrees, and in the illustrated embodiment is about 15 degrees.

The fingers 13 on the forward rods 11 must typically be longer than the fingers on the central rod 9 because the forward rod fingers must extend to a more forward location nearer to the ideal, equilateral location for supporting the wafer holder platform 20. In the illustrated embodiment, a length L1 of each finger 13 of the forward rods 11 is about 60 mm (FIG. 4). Also in the illustrated embodiment, a length L2 of each finger 13 of the central rod 9 is about 28 mm (FIG. 5). Other lengths consistent with the teachings of the present invention are contemplated. As is well known in the art, during high-temperature heat treatment, increasing the lengths L1, L2 of the fingers 13 decreases their mechanical stability. This decrease in mechanical stability could lead to plastic deformation and inadequate support or even failure. The fingers 13 of the forward rods 11 have the lengths L1 so that they extend as far forward as possible without exceeding dimensional constraints for mechanical stability.

In use, the wafer boat 1 is readied by placing the wafer holder platforms 20 on the respective fingers 13. Wafers are loaded into the boat 1 so that each wafer is placed on the top surface 22 of one wafer holder platform 20. Typically, the wafers are loaded via a robotic arm, as is well known in the art. Once the boat 1 is loaded with a predetermined number of wafers (ranging from 1 wafer to about 135 wafers using the illustrated embodiment), the boat is received in the vertical furnace. The high-temperature heat treatment is performed, as is well known in the art. Space is provided between each wafer and the wafer holder platform 20 to receive a portion of the robotic arm. After heat treatment and other treatment, the wafers are unloaded from the boat 1, typically using the robotic arm.

In another embodiment of the present invention, illustrated in FIG. 12, the cross-sections of side support rods 100 are wedge-shaped. The side rods 100 each have a tapered cross-section where the cross-section of the rod tapers in the direction of the fingers 13. The outer surfaces 105 of the side rods curve toward the finger such that substantially the entireties of the outer surfaces lie on the circumference of the cross-section of the wafer boat 1. A forward vertical plane VP3 is defined by points 110 nearest to the central rod 9 (i.e., most rear points) where the forward rod fingers 13 and the forward rods 100 meet. This forward vertical plane VP3 is spaced apart a distance D2 from the rear vertical plane VP2. The forward vertical plane VP3 (i.e., the wedge-shaped rods 100) may be located even more forward from the rear vertical plane VP2 than the diamond-shaped rods 11 while staying within the internal diameter constraints of the quartz tube of the vertical furnace. In the illustrated embodiment, the distance D2 between the forward and rear planes VP3, VP2 is about 227 mm, or about 76% of the nominal diameter of the wafer.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawing[s] shall be interpreted as illustrative and not in a limiting sense.

What is claimed is:

1. A wafer boat for use in heat treatment of semiconductor wafers in a furnace, the boat comprising:
    vertical rods,
    fingers supported by the vertical rods, and
    plates supported by the fingers,
    at least some of the plates including a support surface having at least one planar plateau for supporting the wafer and a recessed surface spaced below the plateau from the support surface and thereby spaced from the wafer, a plurality of arc-shaped holes extending from the recessed surface, and the support surface being free of holes to inhibit contamination of the wafer, wherein the plurality of arc-shaped holes inhibit slip in the wafer during high temperature processing of the wafer.

2. The wafer boat of claim 1 in combination with a semiconductor wafer.

3. The wafer boat of claim 2 wherein at least some of the plates are C shaped.

4. The wafer boat of claim 1 wherein each plate has a bottom surface and the holes extend from the recessed surface through to the bottom surface.

5. The wafer boat of claim 4 wherein the area of each plate is less than 50% of that of the wafer.

6. The wafer boat of claim 4 wherein the area of each plate is less than 40% of that of the wafer.

7. The wafer boat of claim 6 wherein the support surface includes two planar plateaus separated by the recessed surface, the recessed surface defined by a groove.

8. A wafer boat for use in heat treatment of semiconductor wafers in a furnace, the boat comprising:
    vertical rods,
    fingers supported by the vertical rods, and
    plates supported by the fingers,
    at least some of the plates including a support surface having two planar plateaus for supporting the wafer and a recessed surface between the plateaus spaced from the support surface and thereby spaced from the wafer, a plurality of arc-shaped holes extending from the recessed surface, and the support surface being free of holes to inhibit contamination of the wafer, wherein the plurality of arc-shaped holes inhibit slip in the wafer during high temperature processing of the wafer.

9. The wafer boat of claim 8 in combination with a semiconductor wafer.

10. The wafer boat of claim 8 wherein at least some of the plates are C shaped.

11. The wafer boat of claim 8 wherein each plate has a bottom surface and the holes extend from the recessed surface through to the bottom surface.

12. The wafer boat of claim 8 wherein the area of each plate is less than 50% of that of the wafer.

13. The wafer boat of claim 8 wherein the area of each plate is less than 40% of that of the wafer.

* * * * *